United States Patent
Chang et al.

(10) Patent No.: US 7,119,404 B2
(45) Date of Patent: Oct. 10, 2006

(54) HIGH PERFORMANCE STRAINED CHANNEL MOSFETS BY COUPLED STRESS EFFECTS

(75) Inventors: Cheng-Hung Chang, Hsin-Chu (TW); Weng Chang, Taipei (TW); Chu-Yun Fu, Taipei (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/849,689

(22) Filed: May 19, 2004

(65) Prior Publication Data

US 2005/0260806 A1    Nov. 24, 2005

(51) Int. Cl.
*H01L 31/62* (2006.01)
*H01L 21/8238* (2006.01)

(52) U.S. Cl. ........................ 257/389; 438/199

(58) Field of Classification Search ........ 438/197–201, 438/211–213, 238, 253, 902, 938; 257/256, 257/272, 368, 384, 389, 395, 412
See application file for complete search history.

(56) References Cited

U.S. PATENT DOCUMENTS

| | | | |
|---|---|---|---|
| 5,989,978 A * | 11/1999 | Peidous | 438/436 |
| 6,472,306 B1 * | 10/2002 | Lee et al. | 438/623 |
| 2004/0159834 A1 * | 8/2004 | Huang et al. | 257/18 |
| 2004/0235236 A1 * | 11/2004 | Hoffmann et al. | 438/231 |
| 2004/0262683 A1 * | 12/2004 | Bohr et al. | 257/338 |
| 2004/0262784 A1 * | 12/2004 | Doris et al. | 257/900 |
| 2005/0017286 A1 * | 1/2005 | Yeo et al. | 257/310 |
| 2005/0194596 A1 * | 9/2005 | Chen et al. | 257/66 |
| 2005/0214998 A1 * | 9/2005 | Chen et al. | 438/199 |

\* cited by examiner

*Primary Examiner*—Andy Huynh
*Assistant Examiner*—Calvin Lee
(74) *Attorney, Agent, or Firm*—Tung & Associates

(57) ABSTRACT

Strained channel transistors including a PMOS and NMOS device pair to improve an NMOS device performance without substantially degrading PMOS device performance and method for forming the same, the method including providing a semiconductor substrate; forming strained shallow trench isolation regions in the semiconductor substrate; forming PMOS and NMOS devices on the semiconductor substrate including doped source and drain regions; forming a tensile strained contact etching stop layer (CESL) over the PMOS and NMOS devices; and, forming a tensile strained dielectric insulating layer over the CESL layer.

27 Claims, 4 Drawing Sheets

HIGH PERFORMANCE STRAINED CHANNEL MOSFETS BY COUPLED STRESS EFFECTS

FIELD OF THE INVENTION

This invention generally relates to formation of MOSFET devices by integrated circuit manufacturing processes and more particularly to strained channel MOSFET devices and method of forming the same to improve both NMOS and PMOS performance by coupled effects of stressed dielectric layer portions.

BACKGROUND OF THE INVENTION

As is well known, increased device density, together with higher speed performance and lower power consumption are major driving forces in improving integrated circuit manufacturing devices and methods. For example, CMOS design considerations for high speed digital applications are usually determined by the pull up time and pull down time of each individual gate. Individual gates are associated with a delay time period for signal propagation in PMOS and NMOS gate electrodes. The delay time period, in turn, is inversely proportional to the drive current ($I_{drive}$). It is therefore clear that maximizing the drive current will increase the performance speed or Figure of Merit (FOM) of a CMOS device.

Mechanical stresses are known to play a role in charge carrier mobility which affect several critical parameters including Voltage threshold ($V_T$) shift, drive current saturation ($I_{Dsat}$), and drive current ($I_{drive}$). Of particular importance as a measure of the speed of device performance is the value of $I_{on}$–$I_{off}$, also referred to as the drive current ($I_{drive}$). The effect of locally induced mechanical stresses to strain a MOSFET device channel region and the consequential effect on charge carrier mobility is believed to be influenced by complex physical processes related to acoustic and optical phonon scattering. Ideally, an increase in charge carrier mobility in the channel region of the MOSFET will increase the drive current ($I_{drive}$)

Prior art processes have proposed several approaches to inducing strain in a MOSFET channel region. For example, biaxial in-plane tensile strain induced by Si/SiGe lattice mismatch has been successfully introduced for both bulk silicon and silicon on insulator (SOI) CMOS devices. However, several shortcomings are associated with this approach including issues such as cost and process integration issues related to scalability and acceptable manufacture and performance of conventional CMOS device structures such as shallow trench isolation (STI) structures.

Prior art processes have also attempted to introduce mechanical strain into the channel region by forming a stressed (strained) contact etching stop layer over the polysilicon gate structure. In this approach, the degree of strain induced in the channel region is limited by the size of the offset spacer which is dictated by design requirements of source/drain formation. For example the offset spacers act as a buffer between the stressed contact etching stop layer and the channel region, limiting the degree of strain which can be introduced into the channel region.

Another problem with prior art channel stressing techniques include the opposing effects on NMOS and PMOS device performance in introducing localized mechanical stresses to strain a channel region. For example, tensile strain (stress) introduction into the channel region improves NMOS performance while degrading PMOS performance, while compressive stress (strain) has the opposite effect. As a result, unacceptable trade-offs between NMOS and PMOS performance is necessary in prior art channel strain inducing techniques.

One effort in the prior art that has been proposed to overcome the problem of opposite polarity CMOS device degradation include ion implanting the contact etching stop layer overlying the opposite polarity device with Ge ions to relax the stress in the contact etch stop layer (CESL). For example, nitride contact etch stop layers of the prior art have been formed with a relatively high level of tensile stress requiring a high level of ion implantation to selectively relax the tensile stress in the CESL overlying e.g., a PMOS device. As a result, the nitride contact etch stop layer may be severely damaged, which can have the effect of undesirably changing etching rates and causing unintentional overetching in subsequent contact formation processes, for example causing damage to underlying silicon or polysilicon portions of a CMOS device, thereby degrading device performance and reliability.

Other approaches to overcoming the degrading effects of a selected type of mechanical stress on a device of opposite polarity have included selectively implanting the gate electrode with different dopant ions including an overlying high tensile stressed capping layer over the gate electrode to achieve, for example, a compressive stress on annealing the gate electrode of an NMOS or NFET device.

The prior art approaches in general, suffer from manufacturing cost, process integration issues and difficulty in producing acceptable device quality to achieve desired device performance and reliability.

These and other shortcomings demonstrate a continuing need in the MOSFET integrated circuit manufacturing art for improved strained channel MOSFETs and manufacturing methods to reliably and predictably achieve improved device performance while ensuring device reliability.

It is therefore an object of the present invention to provide improved strained channel MOSFETs and manufacturing methods to reliably and predictably achieve improved device performance while ensuring device reliability, in addition to overcoming other shortcomings of the prior art.

SUMMARY OF THE INVENTION

To achieve the foregoing and other objects, and in accordance with the purposes of the present invention, as embodied and broadly described herein, the present invention provides strained channel transistors including a PMOS and NMOS device pair to improve an NMOS device performance without substantially degrading PMOS device performance and method for forming the same.

In a first embodiment, the method includes providing a semiconductor substrate; forming strained shallow trench isolation regions in the semiconductor substrate; forming PMOS and NMOS devices on the semiconductor substrate including doped source and drain regions; forming a tensile strained contact etching stop layer (CESL) over the PMOS and NMOS devices; and, forming a tensile strained dielectric insulating layer over the CESL layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to exemplary NMOS and PMOS MOSFET devices, it will be appreciated that aspects of the present invention may be applied to the formation of any MOSFET device whereby a plurality of locally mechanically induced stresses in front-end-of-line (FEOL) processes are selectively coupled to produce an improved performance of both NMOS and PMOS devices including improved drive current ($I_{drive}$)

Referring to FIGS. 1A–1E in an exemplary process flow for forming the MOSFETS of the present invention, are shown cross-sectional schematic views of a portion of a semiconductor wafer at stages of an exemplary integrated circuit manufacturing process.

Figure 1A:
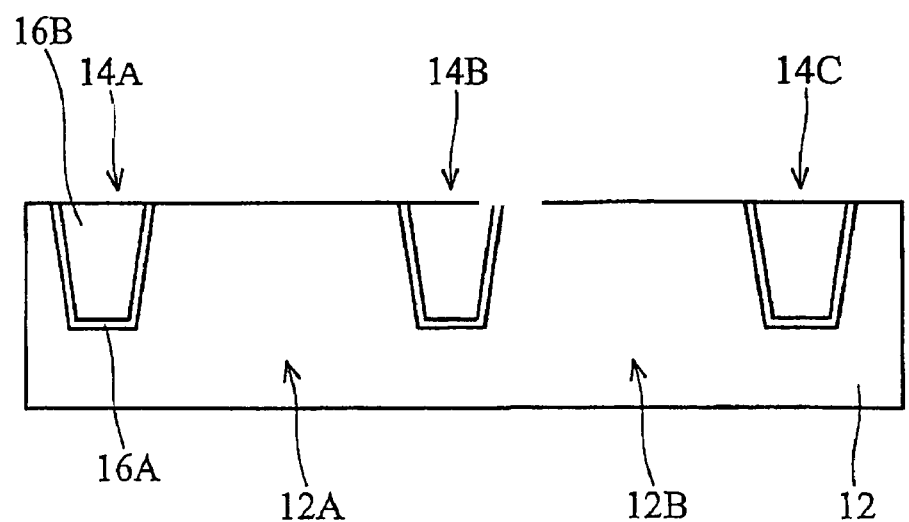
FIGS. 1A–1E are cross sectional schematic views of exemplary portions of a CMOS device including NMOS and PMOS devices at stages of manufacture according to an embodiment of the present invention.

For example, referring to FIG. 1A, is shown a semiconductor substrate 12, which may include silicon, strained semiconductor, compound semiconductor, multi-layered semiconductors, or combinations thereof. For example, the substrate 12 may include, but is not limited to, silicon on insulator (SOI), stacked SOI (SSOI), stacked SiGe on insulator (S-SiGeOI), SiGeOI, and GeOI, or combinations thereof. In a preferred embodiment, the substrate is silicon including doped well regions 12A and 12B making up respective NMOS and PMOS device regions formed by conventional methods, for example a masking process followed by ion implantation and activation annealing.

In a first embodiment, still referring to FIG. 1A, shallow trench isolation (STI) structures e.g., 14A, 14B, and 14C, are preferably formed having a tensile stress (strain). Preferably the backfilling material is formed with a relatively tensile and/or reduced compressive stress filling material compared to HDP-CVD oxide or PECVD oxide. For example, STI trench openings are first formed by conventional processes, followed by formation of a tensile stressed liner e.g., 16A (e.g., silicon nitride and/or silicon oxynitride) and/or backfilled with a thermal CVD deposited silicon oxide material 16B at atmospheric or sub-atmospheric pressures to form a relatively tensile strained oxide. For example, in an important aspect of the invention a silicon oxide material, for example, undoped silicate glass (USG), is advantageously formed by a thermal CVD process carried out at temperatures of up to about 500° C. A subsequent annealing process may optionally be carried out at a temperature of up to about 500° C. to make the silicon oxide material 16B relatively more tensile following the thermal CVD process. For example the STI oxide 16B may be formed having a tensile stress of up to about 200 MPa, while the nitride liner 16A may be formed having a tensile strain up to about 2 GPa. Subsequent processes such as etchback and planarization are then carried out to complete the STI formation process Referring to FIG. 1B, MOSFET devices e.g., NMOS device 18A and PMOS device 18B are then formed by conventional processes. For example, gate structures are formed by conventional processes including gate dielectric portions e.g., 20A and 20B including overlying gate electrode portions e.g., 22A and 22B.

For example, the gate dielectric portions e.g., 20A and 20B may be formed of silicon oxide, silicon oxynitride, silicon nitride, nitrogen doped silicon oxide, high-K dielectrics, or combinations thereof. The high-K dielectrics may include metal oxides, metal silicates, metal nitrides, transition metal-oxides, transition metal silicates, metal aluminates, and transition metal nitrides, or combinations thereof. The gate dielectric portions e.g., 20A and 20B may be formed by any process known in the art, e.g., thermal oxidation, nitridation, sputter deposition, or chemical vapor deposition. The physical thickness of the gate dielectric portions e.g., 16A and 16B may be in the range of 5 to 100 Angstroms. When using a high permittivity (high-K) gate dielectric, the dielectric constant is preferably greater than about 3.9. The high-K dielectric may be selected from a group comprising aluminum oxide ($Al_2O_3$), hafnium oxide ($HfO_2$), hafnium oxynitride (HfON), hafnium silicate (HfSiO$_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

The gate electrode portions e.g., 22A, 22B may be formed of doped polysilicon, polysilicon-germanium, metals, metal silicides, metal nitrides, or conductive metal oxides. In a preferred embodiment, the gate electrodes are formed of doped polysilicon.

Figure 1B:
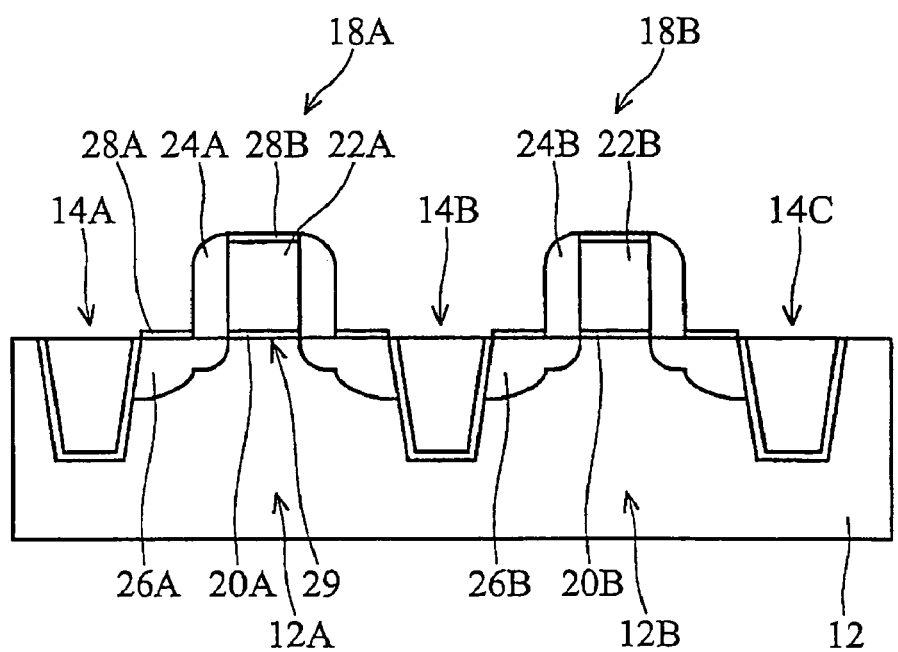

Still referring to FIG. 1B, offset spacers e.g., 24A and 24B, which may be formed of composite oxide/nitride materials are formed along either side of the gate respective NMOS and PMOS gate structure sidewalls by depositing one or more layers of silicon oxide, silicon nitride (e.g., $Si_3N_4$) and/or silicon oxynitride (e.g., SiON), followed by wet or dry etching away portions of the one or more layers to form self-aligned offset spacers on either side of the gate structures. It will be appreciated that the offset spacers may include first forming an offset liner (not shown), e.g., oxide adjacent the gate structure to space a subsequently formed LDD doped region (e.g., ion implantation) away from the gate structure. In addition, ion implanted source and drain (S/D) regions e.g., 26A and 26B are preferably formed in the substrate, for example following formation of main spacers e.g., nitride/oxide 24A and 24B. A protective oxide layer (not shown) may be formed over the surface prior to an activation anneal of the S/D regions and later removed prior to a salicide formation process.

Still referring to FIG. 1B, in another embodiment, self aligned silicide regions (salicides) e.g., 28A, 28B are then formed by conventional processes over the S/D regions e.g., 26A and over the upper portion of the gate electrodes e.g., 22B. Preferably, nickel silicide (e.g., NiSi) is used to form the salicide regions e.g., 28A, 28B as it has been unexpectedly found that source and drain regions may be advantageously strained to induce a strain e.g. a tensile strain into the channel region e.g., 29 at preferred annealing temperatures to form the NiSi phase following Ni deposition. Preferably the NiSi annealing temperature is carried out at a temperature of about 375° C. to about 400° C.

Figure 1C:
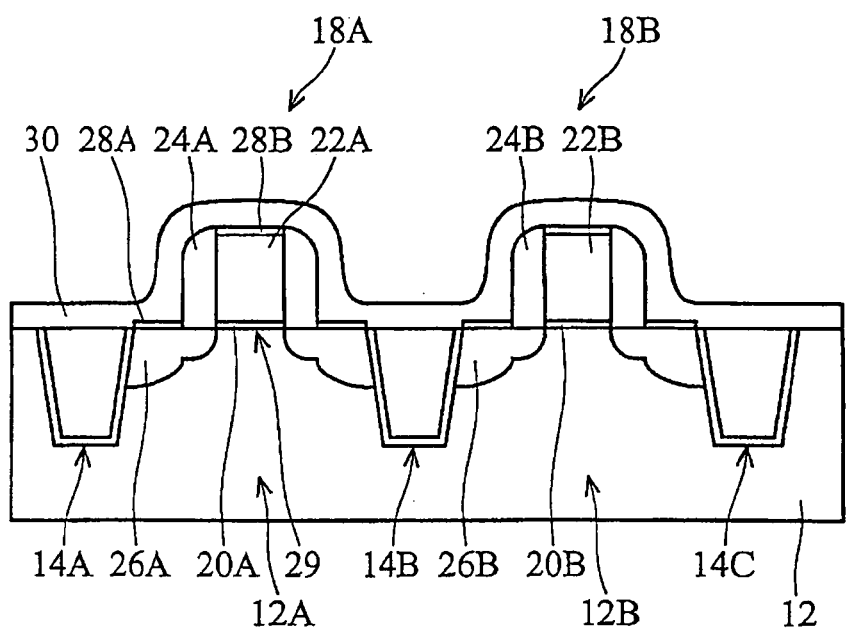

Referring to FIG. 1C, in another embodiment, at least one tensile stressed (strained) dielectric layer, also referred to as a contact etch stop layer (CESL) e.g., 30 is formed over the NMOS and PMOS device regions to cover the respective NMOS and PMOS devices. In an important aspect of the invention, the CESL layer is preferably formed having tensile stress up to about 10 GPa, more preferably between about 500 Mpa and about 2.0 GPa. The tensile stressed dielectric layer 30 may be formed of silicon oxide, silicon nitride, silicon oxynitride, or combinations thereof, but is more preferably formed of silicon nitride (e.g., SiN) by a plasma enhanced CVD (PECVD) mixed frequency process.

For example, preferably, a dual RF power source having a range of frequency from about 50 KHz to about 13.56 MHz used for the PECVD process. For example, the mixed frequency method includes supplying a precursor such as silane ($SiH_4$) and/or hexacholorodisilane (HCD) ($Si_2Cl_6$) and $NH_3$ at a deposition temperature of from about 300° C. to about 600° C. at pressures of from about 50 mTorr to about 5 Torr and high frequency RF powers of from about 70 Watts to about 300 Watts and low frequency RF powers of from about 5 Watts to 60 Watts.

Figure 1D:
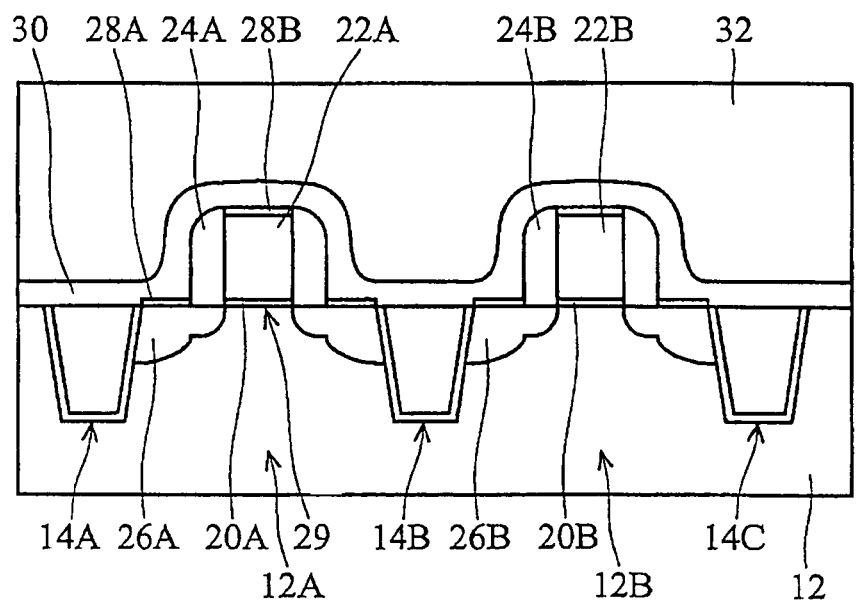
Figure 1E:
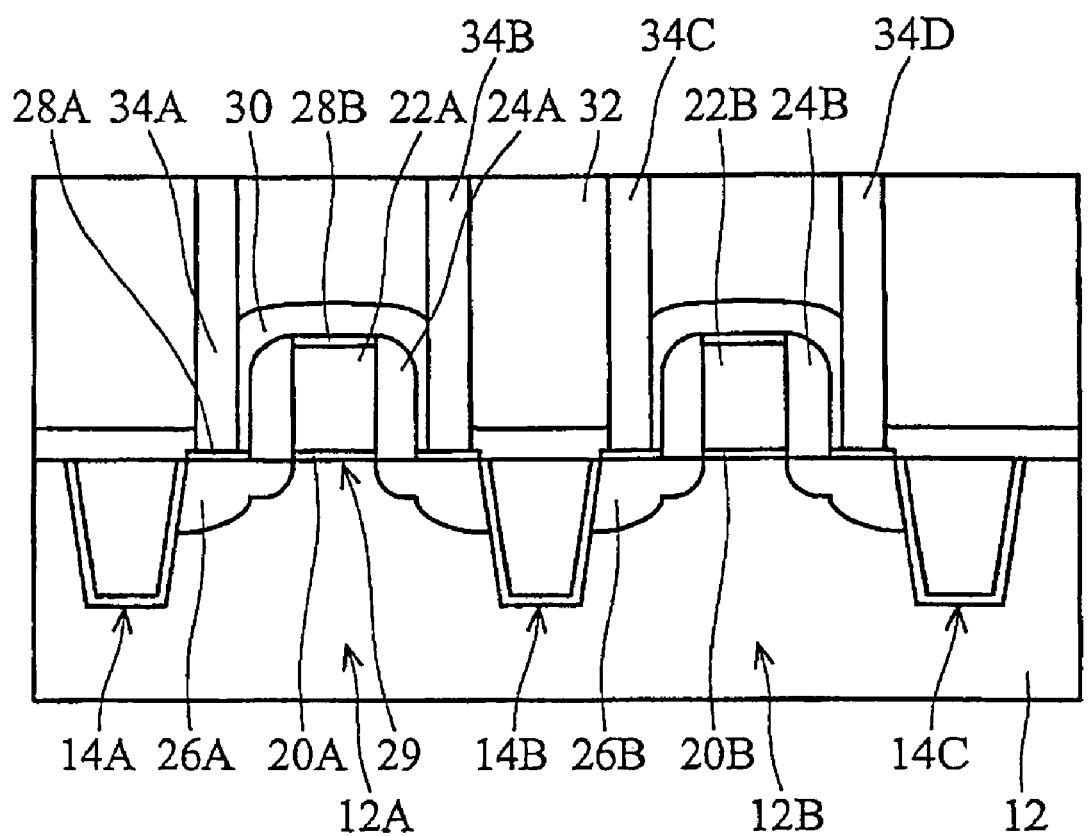

Referring to FIG. 1D, in an important aspect of the invention, a dielectric insulating layer 32, e.g., pre-metal dielectric (PMD) is formed over the CESL layer 30 having a tensile stress up to about 200 MPa. The PMD layer 32 is preferably a silicon oxide layer formed, for example doped or undoped silicon oxide formed by a thermal CVD process, e.g., USG or PSG (phosphorous doped). Alternatively the tensile stress silicon oxide may be formed of undoped or P-doped spin on glass (SOG). In a preferred embodiment, the PMD layer is formed by a thermal CVD process carried out at temperatures of up to about 500° C. A subsequent annealing process may optionally be carried out at a temperature of up to about 500° C. to make the silicon oxide relatively more tensile following the thermal CVD process.

Subsequent conventional processes are then carried out to complete formation of the PMD layer 32 including planarization followed by formation of metal filled contacts e.g., 34A, 34B, 34C, and 34D for example to contact the S/D regions to form device electrical contacts.

Figure 2:
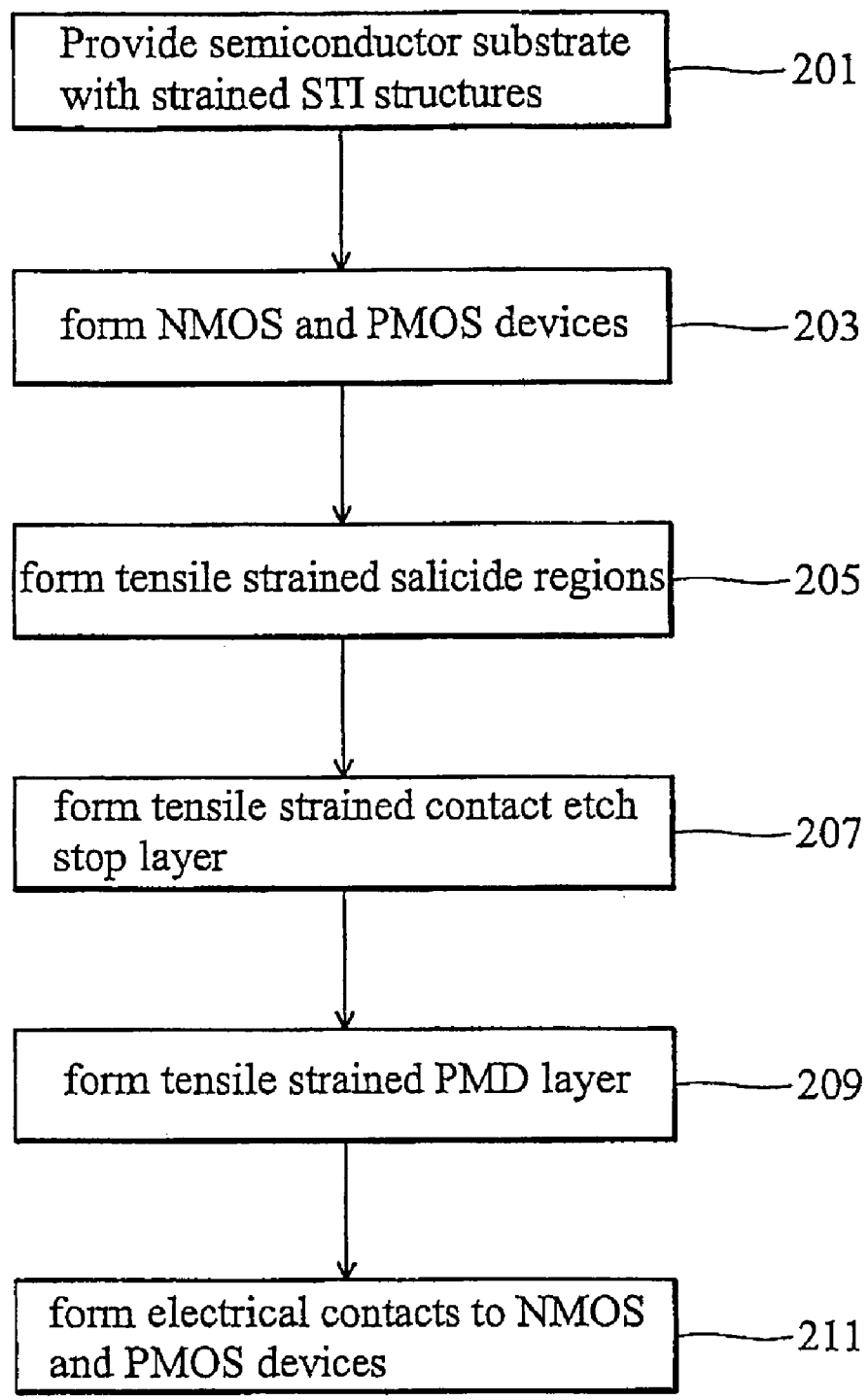
FIG. 2 is a process flow diagram including several embodiments of the present invention.

Referring to FIG. 2 is a process flow diagram including several embodiments of the present invention. In process 201, a substrate having active regions electrically isolated by strained STI structures are formed. In process 203, NMOS and PMOS devices are formed over respective active regions. In process 205, strained salicide regions are formed over the S/D regions. In process 207, a high tensile strain contact etch stop (CESL) layer is formed over the NMOS and PMOS device regions. In process 209, a tensile strained PMD layer is formed over the CESL layer. In process 211, contacts to the respective NMOS and PMOS devices are formed.

Thus an NMOS and PMOS device pair and method for forming the same has been presented for optimally coupling selectively stressed dielectric and salicide portions to deliver a selected strain to a channel region to improve device performance of an NMOS device while avoiding degradation of a PMOS device performance. For example, employing all of the preferred embodiments of the present invention, for example including forming strained STI structures, strained NiSi salicides, a tensile CESL and a tensile PMD layer according to the preferred embodiments, it has been unexpectedly found that the NMOS device performance (drive current) may be improved up to about 12% while substantially avoiding degradation (e.g., less than about 1%) of PMOS drive current. Advantageously, an improvement to NMOS device performance can be achieved without the necessity of additional masking and etching steps to separately treat NMOS and PMOS device regions to avoid opposite polarity device performance degradation as in prior art processes.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A strained channel transistor pair comprising:
   a semiconductor substrate comprising tensile strained shallow trench isolation structures adjacent respective active areas for forming PMOS and NMOS devices;
   the PMOS and NMOS devices on the respective active areas, each of said PMOS and NMOS devices comprising doped source and drain regions disposed in the semiconductor substrate adjacent each of said PMOS and NMOS devices;
   compressive strained salicides on the doped source and drain regions;
   a tensile strained contact etching stop layer (CESL) over the PMOS and NMOS devices; and,
   a tensile strained dielectric insulating layer on the CESL layer.

2. The strained channel transistor pair of claim 1, wherein the salicides are formed of a material consisting essentially of nickel silicide (NiSi).

3. The strained channel transistor pair of claim 1, wherein the strained shallow trench isolation regions comprise a material selected from the group consisting of a tensile strained PECVD nitride liner and a tensile strained thermal CVD silicon oxide filling.

4. The strained channel transistor pair of claim 1, wherein the tensile strained dielectric insulating layer is formed of a material selected from the group consisting of thermal CVD silicon oxide, undoped silicate glass (USG), phosphorous doped silicate glass (PSG), undoped spin on glass (SOG), and phosphorous doped spin on glass (SOG).

5. The strained channel transistor pair of claim 1, wherein the tensile strained dielectric insulating layer has a stress level of up to about 200 MPa.

6. The strained channel transistor pair of claim 1, wherein the tensile strained CESL layer is selected from the group consisting of silicon oxide, silicon nitride, and silicon oxynitride.

7. The strained channel transistor pair of claim 1, wherein the tensile strained CESL layer consists essentially of PECVD silicon nitride.

8. The strained channel transistor pair of claim 1, wherein the tensile strained CESL layer is formed having a tensile stress between about 500 MPa and about 2 GPa.

9. A strained channel NMOS and PMOS device pair with improved NMOS performance without substantially degrading PMOS device performance comprising:
   a semiconductor substrate comprising tensile strained shallow trench isolation structures adjacent respective active areas for forming PMOS and NMOS devices;
   the PMOS and NMOS devices on the respective active areas, each of said PMOS and NMOS devices comprising doped source and drain regions disposed in the semiconductor substrate adjacent each of said PMOS and NMOS devices;
   compressive strained salicides on the source and drain regions;
   a tensile strained contact etching stop layer (CESL) over the PMOS and NMOS devices; and,
   a tensile strained dielectric insulating layer on the CESL layer.

10. The strained channel NMOS and PMOS device pair of claim 9, wherein the salicides are formed of a material consisting essentially of nickel silicide (NiSi).

11. The strained channel NMOS and PMOS device pair of claim 9, wherein the strained shallow trench isolation regions comprise a material selected from the group consisting of a tensile strained PECVD nitride liner and a tensile strained thermal CVD silicon oxide filling.

12. The strained channel NMOS and PMOS device pair of claim 9, wherein the tensile strained dielectric insulating layer is formed of a material selected from the group consisting of thermal CVD silicon oxide, undoped silicate glass (USG), phosphorous doped silicate glass (PSG), undoped spin on glass (SOG), and phosphorous doped spin on glass (SOG).

13. The strained channel NMOS and PMOS device pair of claim 9, wherein the tensile strained dielectric insulating layer has a stress level of up to about 200 MPa.

14. The strained channel NMOS and PMOS device pair of claim 9, wherein the tensile strained CESL layer is selected from the group consisting of silicon oxide, silicon nitride, and silicon oxynitride.

15. The strained channel NMOS and PMOS device pair of claim 9, wherein the tensile strained CESL layer consists essentially of PECVD silicon nitride.

16. The strained channel NMOS and PMOS device pair of claim 9, wherein the tensile strained CESL layer is formed having a tensile stress between about 500 MPa and about 2 GPa.

17. The strained channel NMOS and PMOS device pair of claim 9, wherein the tensile strained shallow trench isolation structures comprise a material selected from the group consisting of a tensile strained PECVD nitride liner and a tensile strained thermal CVD silicon oxide filling.

18. A strained channel NMOS and PMOS device pair for improving NMOS performance without substantially degrading PMOS device performance comprising:
    a semiconductor substrate comprising tensile strained shallow trench isolation structures adjacent respective active areas comprising PMOS and NMOS devices;
    each of said PMOS and NMOS devices comprising doped source and drain regions disposed in the semiconductor substrate adjacent each of said PMOS and NMOS devices;
    compressive strained salicides on the source and drain regions; and,
    wherein a tensile strained contact etching stop layer (CESL) is disposed over both the PMOS and NMOS devices.

19. The strained channel NMOS and PMOS device pair of claim 18, further comprising a tensile strained PMD layer disposed on the CESL layer over both the PMOS and NMOS devices.

20. The strained channel NMOS and PMOS device pair of claim 18, wherein the strained shallow trench isolation regions comprise a material selected from the group consisting of a tensile strained PECVD nitride liner and a tensile strained thermal CVD silicon oxide filling.

21. The strained channel NMOS and PMOS device pair of claim 19, wherein the tensile strained PMD layer is formed of a material selected from the group consisting of thermal CVD silicon oxide, undoped silicate glass (USG), phosphorous doped silicate glass (PSG), undoped spin on glass (SOG), and phosphorous doped spin on glass (SOG).

22. The strained channel NMOS and PMOS device pair of claim 19, wherein the tensile strained PMD layer has a stress level of up to about 200 MPa.

23. The strained channel NMOS and PMOS device pair of claim 18, wherein the tensile strained CESL layer is selected from the group consisting of silicon oxide, silicon nitride, and silicon oxynitride.

24. The strained channel NMOS and PMOS device pair of claim 18, wherein the tensile strained CESL layer consists essentially of PECVD silicon nitride.

25. The strained channel NMOS and PMOS device pair of claim 18, wherein the tensile strained CESL layer is formed having a tensile stress between about 500 MPa and about 2 GPa.

26. The strained channel transistor pair of claim 18, wherein the tensile strained shallow trench isolation structures comprise a material selected from the group consisting of a tensile strained PECVD nitride liner and a tensile strained thermal CVD silicon oxide filling.

27. The strained channel NMOS and PMOS device pair of claim 18, wherein the compressive strained salicides are formed of a material consisting essentially of nickel suicide (NiSi).

* * * * *